United States Patent
Kardo-Syssoev et al.

[11] Patent Number: 6,087,871
[45] Date of Patent: Jul. 11, 2000

[54] PULSE GENERATING CIRCUITS USING DRIFT STEP RECOVERY DEVICES

[76] Inventors: Alexei F. Kardo-Syssoev, Flat 3, Building 75/2, Toresa Street, St. Petersburg 194214; Vladimir M. Efanov, Flat 204, Building 100/2, Leninsky Prospect, St. Petersburg 198332; Sergey V. Zazulin, Flat 76, Building 12/1, Turku Street, St. Petersburg 192238; Igor G. Tchashnikov, Flat 25, Building 9, Shkolnaya Street, St. Petersburg 197183, all of Russian Federation

[21] Appl. No.: 08/806,645

[22] Filed: Feb. 26, 1997

Related U.S. Application Data

[63] Continuation of application No. 08/555,993, Nov. 15, 1995, abandoned.

[51] Int. Cl.⁷ .................................................. H03K 3/33
[52] U.S. Cl. ........................................ 327/189; 327/493
[58] Field of Search .................................... 327/113, 114, 327/184, 188, 189, 190, 374, 493

[56] References Cited

U.S. PATENT DOCUMENTS

| | | | |
|---|---|---|---|
| 3,527,966 | 9/1970 | Forge | 307/319 |
| 3,676,708 | 7/1972 | Uchida | 307/263 |
| 3,764,830 | 10/1973 | Blore et al. | 307/260 |
| 3,832,568 | 8/1974 | Wang | 307/106 |
| 4,425,515 | 1/1984 | Larson | 307/268 |

FOREIGN PATENT DOCUMENTS

| 1581149 | 7/1987 | Russian Federation . |
|---|---|---|
| 1783606 | 12/1992 | Russian Federation . |

OTHER PUBLICATIONS

Kardo–Syssoev et al, "Fast Power Switches From Picosecond to Nanosecond time Scale and Their Application to Pulsed Power" presented Jul. 12, 1995 at the 10th IEEE Pulsed Power Conference, Albuquerque NM.

*Primary Examiner*—Jeffrey Zweizig
*Attorney, Agent, or Firm*—Roylance, Abrams, Berdo & Goodman, L.L.P.

[57] ABSTRACT

A pulse generating circuit utilizes a drift step recovery transistor to apply power from a direct current power supply to a pulse forming network when a trigger pulse is applied thereto. The pulse forming network comprises a storage inductor connected in series with the transistor, a series connected separating diode and a drift step recovery diode which are connected in parallel with the storage inductor, a series connected pumping inductor and pumping resistor which together form a pumping circuit connected in parallel with respect to the separating diode, and a load resistor. Current passed via the transistor increases in the storage inductor and the pumping inductor and is blocked by the separating diode to inject electron-hole plasma from the pumping inductor into the drift step recovery diode when the transistor is conducting. The transistor blocks current at the end of the trigger pulse, and the storage inductor reverses polarity to bias the separating diode into a conducting state to extract the plasma from the drift step recovery diode. The drift step recovery diode blocks current after the plasma has been extracted to switch current from the storage inductor into the load resistor to generate a pulse.

16 Claims, 5 Drawing Sheets

PULSE GENERATING CIRCUITS USING DRIFT STEP RECOVERY DEVICES

This is a continuation of application Ser. No. 08/555,993 filed Nov. 15, 1995, now abandoned.

FIELD OF THE INVENTION

The present invention relates to circuits for generating high voltage pulses having fast rise and decay times on the order of nanoseconds and a pulse repetition rate on the order of Megahertz. Further, the present invention relates to circuits for generating pulses using drift step recovery semiconductor devices.

BACKGROUND OF THE INVENTION

Generation of nanosecond pulses is important for electromagnetic (EM) telecommunications (e.g., radar or microwave), lasers and other applications. The pulse shape can be bell or step-shaped, among others. The power, repetition frequency and rise time of the pulse, however, are more important characteristics than its shape in EM telecommunications. Voltage is preferably on the order of 100 volts (V) or higher and depends on frequency. Rise time is preferably 1.0 nanosecond (ns) or less. Step recovery devices (SRDs) have been employed in efforts to achieve these types of pulses. Current SRDs have achieved 1–2 ns rise times, but pulse repetition frequencies are too low. Further, frequencies of greater than 20 Megahertz (MHz) have been achieved with SRDs, but pulse power has been insufficient. Further, SRDs have been acknowledged to have thermal stability problems.

A paper entitled "Fast Power Switches From Picosecond to Nanosecond Time Scale and Their Application to Pulsed Power" by A. F. Kardo-Syssoev et al of the Ioffe Physico-Technical Institute, Academy of Science, St. Petersburg, Russia, addresses super fast voltage restoration and super fast reversible delayed breakdown effects in high voltage semiconductor p-n junctions discovered at the Ioffe Institute and drift step recovery (DSR) devices and silicon avalanche shapers (SASS) exhibiting these effects. In contrast with an SRD, a drift step recovery diode (DSRD) is designed with a particular doping profile of p-layer (i.e., a p-layer consisting of both a heavily doped portion and a lower doped portion) and uses a pulse as opposed to a DC signal to pump current carriers (i.e., charge) into the device. Pumping is carefully controlled and should not be longer than 300 ns for a DSRD. When all of the pumped charge is pulled out of the enriched region, the current suddenly stops or breaks, and the voltage increases across the DSRD. The turn off time depends on the voltage. The rise time (i.e., dV/dt) is on the order of 1.0 kV/ns, and the turn off time is approximately 1.0 ns for a DSRD having a 1.0 kV operating voltage. A DSRD has significantly better thermal stability than an SRD. Several DSRDs (e.g., tens and hundreds of DSRDs) can be assembled in series in a stack with relative ease. Due to negligible loss of pumping charge, all of the DSRDs in the stack break current essentially simultaneously. An output pulse, therefore, can be increased in orders of magnitude while providing the same short front pulse characteristic a single DSRD provides. Due to very short time the DSRD is under high voltage, the DSRD is not sensitive to leakage current. A DSRD is described in Russian patent SU 1581149 A1 for "High Voltage Diode Having Sharp Recovery". A drift step recovery transistor (DSRT) is described in Russian patent SU 1783606 A1 for "Methods of Generation of Voltage Steps".

FIG. 1 depicts a pulse generating circuit discussed in the above-referenced paper that comprises a DSRD, and FIG. 2 illustrates selected waveforms for the circuit. Initially, energy storage capacitors C1 and C2 are charged, and switches S1 and S2 are open. When switch S1 is closed, capacitor C1 discharges via an inductor L1 and the DSRD. Because of the capacitor polarity, the discharge current is forward current for the DSRD. The resistance of the DSRD is low, and the current I1 oscillates in the circuit comprising C1, S1, L1 and the DSRD. The total amount of electron-hole pairs injected or pumped into the DSRD during the first forward half-cycle of current is essentially equal to the charge passing through the DSRD. When the current changes direction on the next half-cycle, the DSRD remains in a high conducting state because of the stored electron-hole pairs. If switch S2 closes at the moment the current I1 crosses zero-level, discharge current I2 through the capacitor C2 is added to the L1, C1 circuit such that the total DSRD current is increased. When the current through the DSRD is maximum, the charge extracted for the $\tau_-$ time period is essentially equal to the charge injected for the $\tau_-$ period. Accordingly, the DSRD breaks current, and the energy initially stored in the capacitors C1 and C2 and accumulated in the inductors L1 and L2 is applied to the load resistance R1.

The front of the load pulse 11 generated by the circuit in FIG. 1 is determined by the turn off time of the DSRD, and the decay time is approximately L/R1 where L is the total inductance of L1 and L2 connected in parallel. The peak load voltage can be many times higher (e.g., on the order of ten times higher) than the initial capacitor voltage. This voltage multiplication is one of a number of advantages of circuits comprising a DSRD. The circuit, however, is disadvantageous because it employs switches S1 and S2 to charge the capacitors. The pulse repetition frequency is not more than 100 kilohertz (kHz) due to the relatively long period of time required to charge the capacitors and the relatively long recovery time of the switches. The use of additional switches for charging the capacitors makes the pulse generating circuit less reliable and more complicated. Another pulse generating circuit, which comprises a drift step recovery transistor (DSRT), eliminates the need to employ capacitors and switches. With reference to FIG. 3, the circuit comprises a direct current (DC) source 13 that is switched to the inductor L via the DSRT following a triggering pulse generated across the secondary winding of a transformer TXFR. The DSRT is pumped during the triggering pulse, and, when the DSRT current breaks, the inductor voltage is applied across a load resistor R. Thus, the pulse repetition frequency is controlled by the pumping time. The output voltage is limited by the transistor voltage.

SUMMARY OF THE INVENTION

In accordance with an aspect of the present invention, an improved pulse generating circuit is provided which increases the pulse repetition frequency to a natural limit determined by the time needed to pump or inject electron-hole plasma into, and extract the plasma out of, a drift step recovery diode in the circuit. A separating diode and pumping inductor and resistor are also added to facilitate pumping.

In accordance with another aspect of the invention, an additional inductor is provided in the pulse generating circuit to reduce undesirable effects of capacitance of the DSRT collector on the pulse decay time.

In accordance with yet another aspect of the invention, a capacitor and a diode are connected to the DSRT to reduce energy loss from DSRT heating and to increase voltage across the DSRD several times with respect to the voltage across the DSRT.

In accordance with still yet another aspect of the invention, a second DSRT with a capacitor and a diode connected to the base thereof is provided in the pulse generating circuit to reduce current losses associated with increased current exchange between the storage and pumping inductors.

A pulse generating circuit is provided which comprises a power supply; a step recovery transistor connected at the collector thereof to the power supply; a trigger pulse generating device connected between the base and emitter of the step recovery transistor; and a pulse forming network connected to the step recovery transistor base for receiving power from the power supply when the trigger pulse is applied to turn on the step recovery transistor. The pulse forming network comprises a storage inductor connected in parallel with a series connected separating diode and a step recovery diode, the separating diode and the step recovery diode being in reverse polarity with respect to each other. The pulse forming network further comprises a series connected pumping inductor and pumping resistor which form a pumping circuit that is connected in parallel with respect to the separating diode, and a load resistor connected to the junction of the step recovery diode and the pumping circuit. Current passed via the step recovery transistor increases in the storage inductor and the pumping inductor and is blocked by the separating diode to inject electron-hole plasma from the pumping inductor into the step recovery diode when the step recovery transistor is conducting. The step recovery transistor blocks current at the end of the trigger pulse. The storage inductor reverses polarity to bias the separating diode into a conducting state to extract the plasma from the step recovery diode. The step recovery diode blocks current after the plasma has been extracted to switch current from the storage inductor into the load resistor to generate a pulse.

BRIEF DESCRIPTION OF THE DRAWINGS

These and other features and advantages of the present invention will be more readily apprehended from the following detailed description when read in connection with the appended drawings, which form a part of this original disclosure, and wherein.

DETAILED DESCRIPTION OF THE PREFERRED EMBODIMENTS

Figure 1:
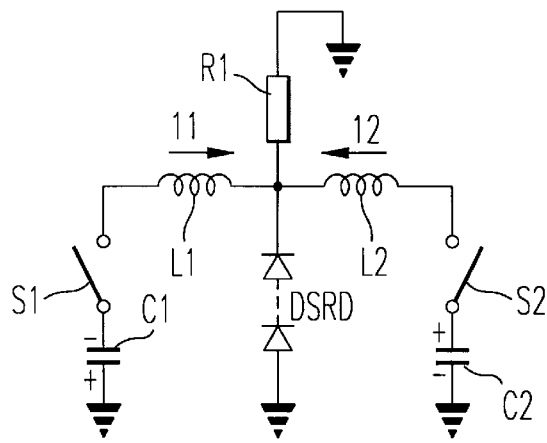
FIG. 1 is schematic diagram of a known pulse generating circuit comprising a drift step recovery diode.
Figure 2:
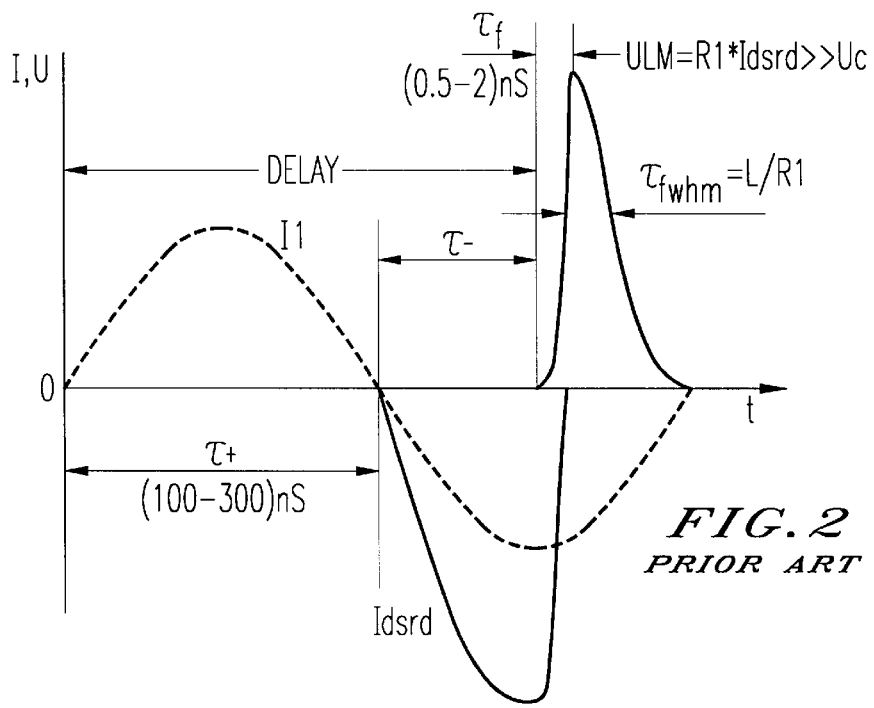
FIG. 2 is a graph illustrating selected current and voltage waveforms of the pulse generating circuit depicted in FIG. 1.
Figure 3:
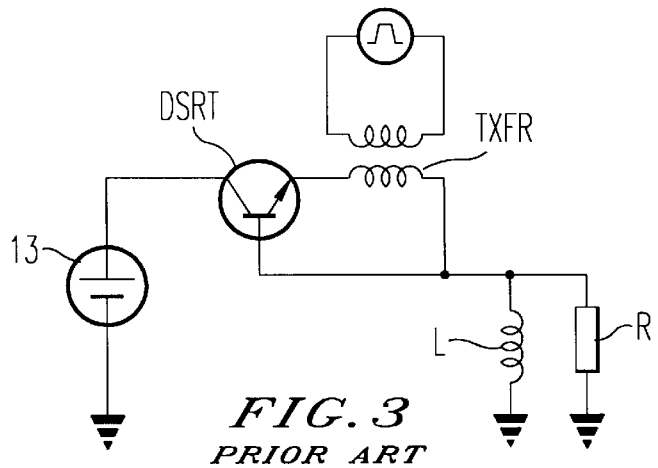
FIG. 3 is a schematic diagram of another known pulse generating circuit comprising a drift step recovery transistor.
Figure 4:
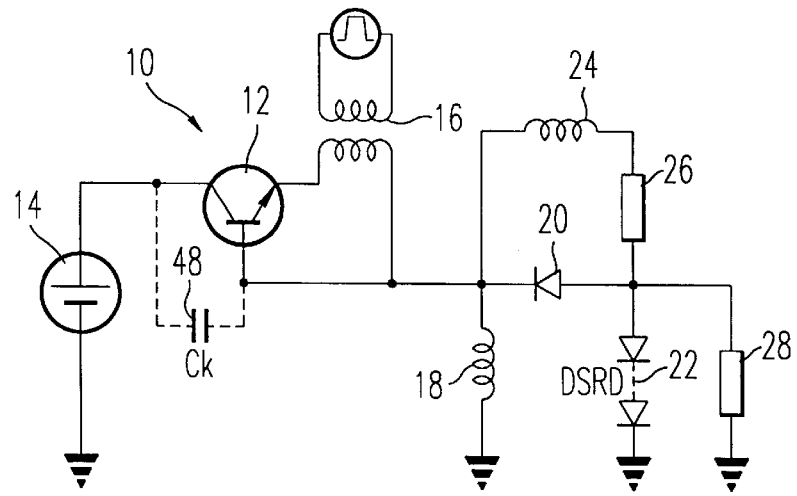
FIG. 4 is a schematic diagram of a pulse generating circuit constructed in accordance with an embodiment of the present invention.

FIG. 4 depicts a pulse generating circuit 10 constructed in accordance with an embodiment of the present invention. The circuit 10 comprises a drift step recovery transistor (DSRT) 12. The collector of the DSRT is connected to a direct current (DC) power source 14. The emitter and base of the DSRT are connected across the secondary winding of a transformer 16. Also connected to the base of the DSRT is one end of a storage inductor 18, the other end of the inductor 18 being connected to a common point or ground. The storage inductor 18 is connected in parallel with a separating diode 20 and a drift step recovery diode (DSRD) 22, which are connected in series and in reverse polarity with respect to each other.

As will be described below, the DSRD decreases the duration of the front of the load pulse, that is, contributes to a sharper pulse. A pumping inductor 24 and a pumping resistor 26 are connected in parallel with respect to the separating diode 20 to pump plasma into the DSRD. The DSRD and DSRT are available from the Ioffe Physico-Technical Institute, Academy of Science, St. Petersburg, Russia. A DSRD is preferred over other commercially available step recovery devices (SRDs) because a DSRD is characterized by fast voltage restoration and high holding voltage. A DSRD has a faster rise time (e.g., two to four times faster) than a DSRT due to the difference in the DSRT structure. A DSRT has an additional gating electrode which, for the same voltage and current, increases the capacitance of the collector more so than in a two electrode DSRD. Depending on the pulse characteristics desired, other commercially available step recovery devices (SRDs) can be used. For example, one or more SRDs can be used in the circuit 10 which undergo more than one stage of pulse compression to obtain a desired time characteristic.

Finally, the circuit 10 in FIG. 4 comprises a load resistor 28 across which a pulse is generated. The load resistor 28 is connected at one end to the junction between the DSRD 22 and the pumping resistor 26, and to a common point or ground at the other end. The inductor 18, the separating diode 20, the DSRD 22, the pumping inductor 24, the pumping resistor 26 and the load resistor 28 shall hereinafter be collectively described as a pulse forming network (PFN).

The operation of the circuit in FIG. 4 will now be described with reference to the graphs depicted in FIGS. 5 and 6. At the initial state, the DSRT 12 blocks DC power from the PFN until a triggering pulse is applied to the DSRT via the transformer 16 (as indicated at 30 in FIGS. 5 and 6). Following the triggering pulse, the DSRT 12 switches to a conducting state and, accordingly, voltage is applied to the storage inductor 18 and to the pumping inductor 24 and pumping resistor 26. The conducting state of the DSRT is indicated at 32 in FIG. 6. The voltage across the DSRT is less negative when it is conducting DC power to the PFN. The current in the storage and pumping inductors 18 and 24, respectively, grow linearly with time, as indicated at 34 in FIG. 5.

Due to the blocking polarity of the separating diode 20, no current flows through the separating diode while the DSRT 12 is conducting. The current from the pumping inductor 24 and resistor 26 instead flows into the DSRD 22 and injects electron-hole plasma into the DSRD, as evidenced by the coinciding lines in FIG. 5 representing the current through pumping inductor 24 and the DSRD and indicated at 36.

Figure 5:
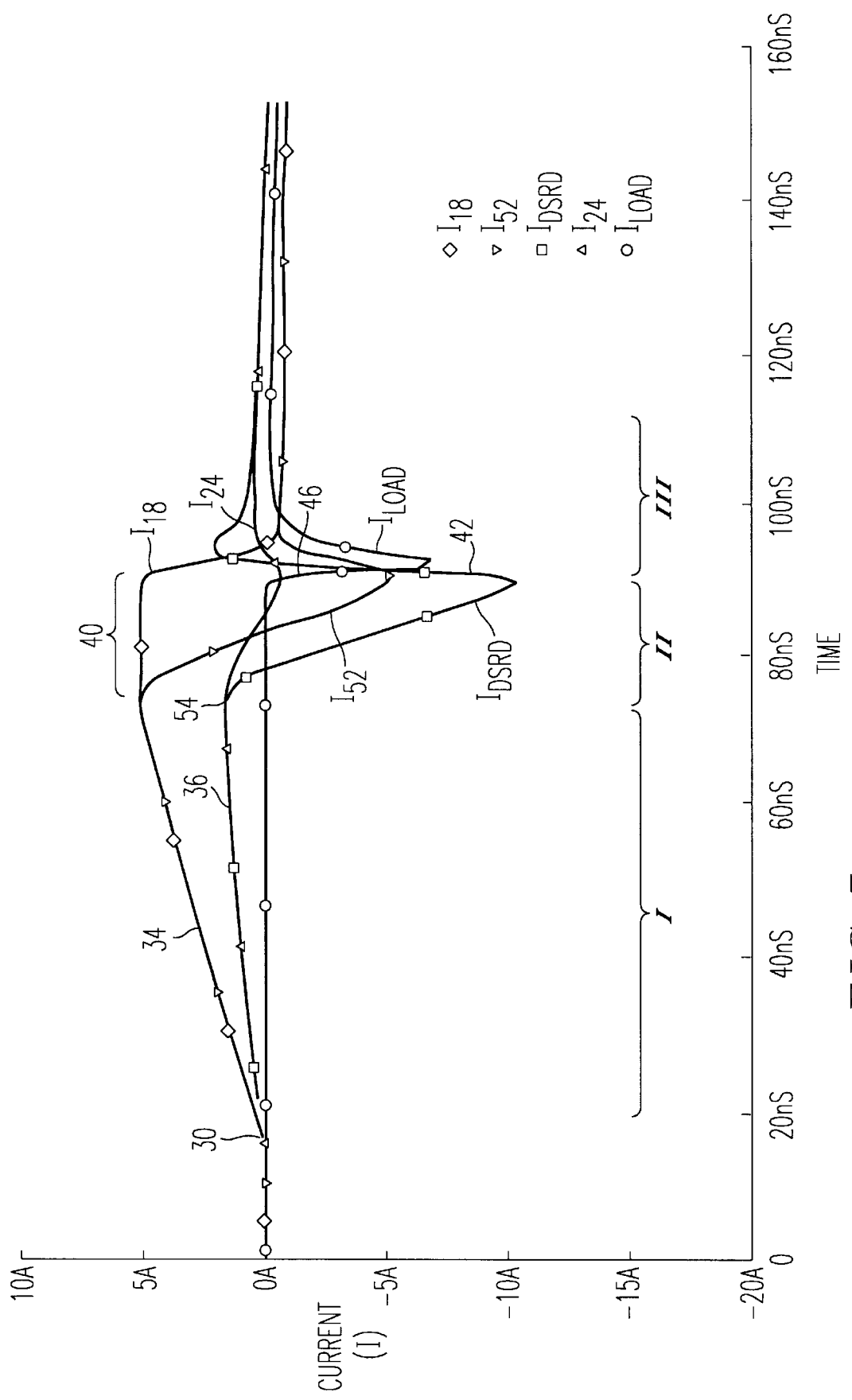
FIGS. 5 and 6 are graphs illustrating selected current and voltage waveforms, respectively, of the pulse generating circuits depicted in FIGS. 4 and 7.
Figure 6:
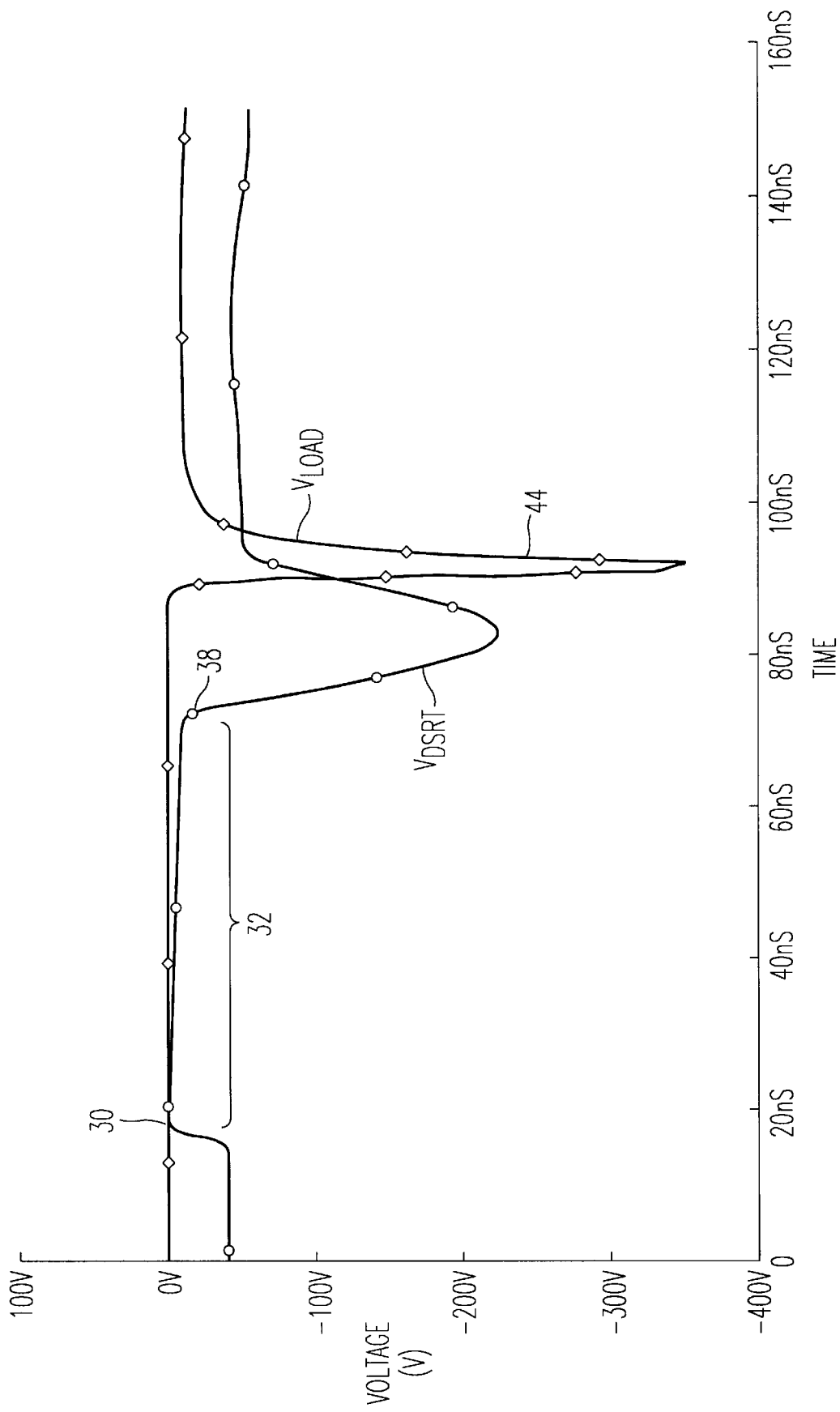

At the end of the triggering pulse, the DSRT breaks current (i.e., after approximately 70 ns in the exemplary circuit 10), as indicated at 38 in FIG. 6. At essentially the same time, the storage inductor 18 changes polarity. Accordingly, the separating diode 20 is biased in the conducting direction, and the current in the storage inductor is switched to the DSRD 22. Since the voltage drop across the DSRD 22 is relatively small, the storage inductor current is nearly constant, as indicated at 40 in FIG. 5. The current causes the plasma that had been injected into the DSRD to be extracted. Once the plasma has been extracted, the DSRD very quickly breaks current (within approximately 1 ns), as indicated at 42 in FIG. 5, and switches the storage inductor 18 current into the load to form an output pulse, as indicated at 44 in FIG. 6.

With continued reference to FIGS. 4, 5 and 6, the front of the load current pulse (indicated at 46 in FIG. 5) corresponds to the turn off time of the DSRD, and the decay time is determined approximately by the relation:

$$t_d = L18/R28 \tag{1}$$

where L18 is the inductance of the storage inductor and R28 is the resistance of the load resistor. After the decay time has elapsed, the circuit elements in circuit 10 are returned to the initial, zero-current state in order for a new cycle of pulse generation to commence. Thus, the minimum period between generated pulses is substantially determined by the sum of the pumping period, the duration of the highly conducting phase of the DSRD during reverse current, and the pulse decay time, as indicated at I, II and III, respectively, in FIG. 5. For high power DSRDs, this minimum period does not exceed hundreds of nanoseconds, and can be as short as tens of nanoseconds. Thus, the pulse repetition frequency of the pulse generating circuits constructed in accordance with various embodiments of the present invention can reach tens of Megahertz.

The pulse generating circuit 10 provides high pulse repetition frequency, but the decay time is increased by the capacitance $Cc_{12}$ of the DSRT 12 collector, which is represented by a capacitor 48 (FIG. 4) drawn in phantom. When the DSRD 22 breaks current, part of the current is used to charge this capacitance $Cc_{12}$. Consequently, the duration of the front of the load pulse becomes longer than the DSRD turn off time. During the pulse decay period, the capacitance $Cc_{12}$ is discharged into the load, thereby lengthening the decay time. It must be noted that maximum blocking voltage of the DSRT is preferably not less than the sum of the output pulse voltage and the DC supply voltage.

Figure 7:
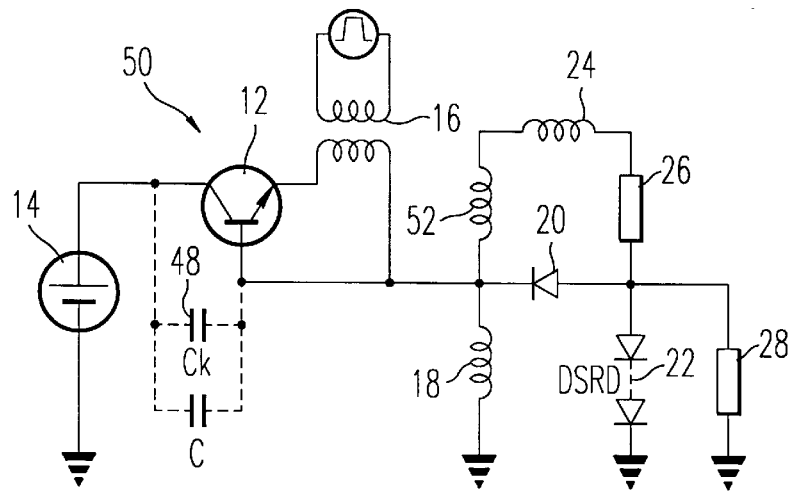
FIGS. 7 and 8 are schematic diagrams of pulse generating circuits constructed in accordance with second and third embodiments, respectively, of the present invention.

To eliminate or suppress these disadvantages, a pulse generating circuit 50 (FIG. 7) is provided with an additional inductor 52 connected between the base of the DSRT 12 and the junction of the storage inductor 18 and the separating diode 20. After a triggering pulse is applied to the DSRT 12 via the transformer, DC source voltage is applied to inductors 18 and 52 which are connected in series. The current in each of these inductors is equal. Thus, when the DSRT 12 breaks current, the DSRD 22 shunts the inductor 18, and the inductor 52 starts to charge the collector capacitance $Cc_{12}$ via the separating diode 20 and the DSRD 22. As in the previous circuit 10 (FIG. 4), the inductor 18 current is nearly constant (see 40 in FIG. 4).

The inductor 52 current, upon charging $Cc_{12}$, oscillates and changes its direction. Thus, both currents of the inductors 18 and 52 flow in reverse direction to the DSRD and pull out the plasma which was previously injected into the DSRD via the pumping inductor 24 and resistor 26. When the DSRD 22 breaks current, the total current of both of the inductors 18 and 52 is switched into the load resistance 28. For the maximum efficiency, the pumping circuit (i.e., inductor 24 and resistor 26) is adjusted such that the DSRD 22 breaks current at the moment when the current in inductor 52 reaches its maximum value while oscillating (as indicated at 54 in FIG. 5). Thus, the load pulse front is equal to the turn off time of the DSRD and is independent of the capacitance $Cc_{12}$ of the collector of the DSRT 12. Further, the decay time is determined by:

$$t_d = L_t/R9 \tag{2}$$

where $L_t$ is the total inductance of inductors 18 and 52 connected in parallel. Thus, the decay time is also independent of the collector capacitance $Cc_{12}$.

It is known that working voltage of the DSRD 22 can be increased by assembling a large number of DSRDs in series, i.e., in a stack. The same approach for the DSRT 12 is complicated and inefficient. The ratio of DSRT voltage to DSRD voltage depends on the collector's capacitance $Cc_{12}$. The larger the capacitance $Cc_{12}$ is, the less likely the DSRT voltage will be at the same DSRD peak voltage. It is possible to increase both the output voltage and the DSRD voltage, while keeping DSRT voltage low, by increasing capacitance $Cc_{12}$. This can be accomplished by adding an additional capacitor C, which is connected in parallel with the capacitance $Cc_{12}$ as shown in phantom in FIG. 7. This approach, however, decreases the efficiency of the circuit 50 shown in FIG. 7. This is because the additional capacitor is initially charged from the DC voltage source 14. While the DSRT 12 conducts, however, the energy stored in the capacitances $Cc_{12}$ and C is lost to the heating of the DSRT. To avoid such losses, an additional capacitor 60 is connected at one end via a diode 58 to the junction of the DSRT 12 base and inductor 52 in accordance with another embodiment of the invention depicted in FIG. 8. The other end of the capacitor 60 is connected to a common point (i.e., can be grounded).

Figure 8:
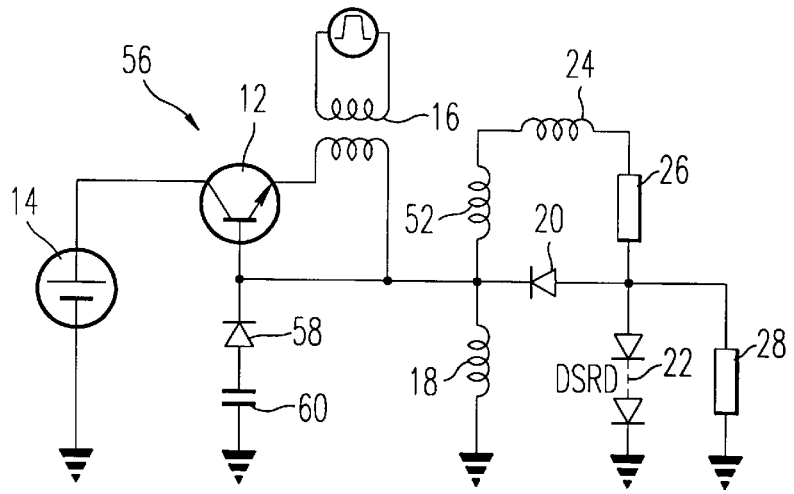

With continued reference to FIG. 8, the diode 58 is connected with a polarity suitable to prevent the charge of capacitor 60 from the DC power supply 14 when the DSRT 12 is conducting. Thus, the additional capacitor 60 does not store or lose energy from the power supply 14, and has no negative effect on efficiency of the pulse generating circuit 56 in FIG. 8. When the DSRT 12 breaks current, the current in the inductor 52 charges the collector capacitance $Cc_{12}$ and the additional capacitor 60 via the diode 58, which passes the current from inductor 52. The current through the capacitor 60 subsequently oscillates and is added to the DSRD 22 current. The connection of additional diode 58 and capacitor 60 increases the voltage across the DSRD 22 by increasing the period of time during which DSRD 22 is in a conducting state.

Figure 9:
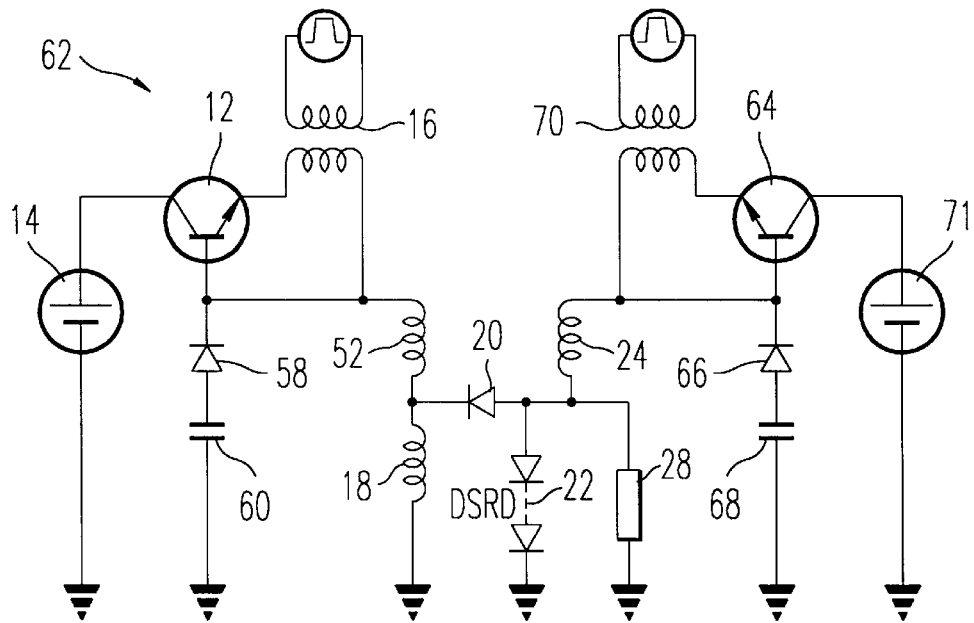
FIG. 9 is a schematic diagram of a pulse generating circuit constructed in accordance with a fourth embodiment of the present invention.
Figure 10A:
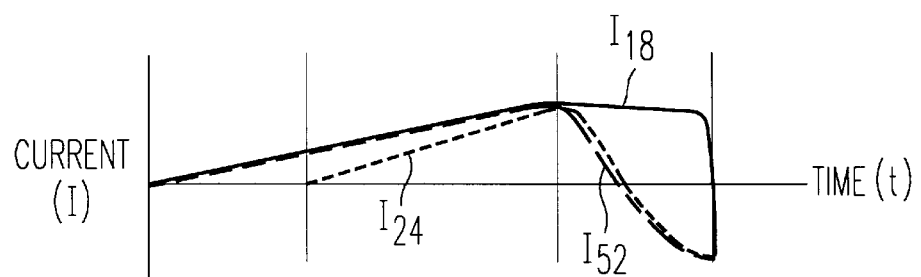
FIG. 10 is a graph illustrating selected current waveforms of the pulse generating circuit depicted in FIG. 9.
Figure 10B:
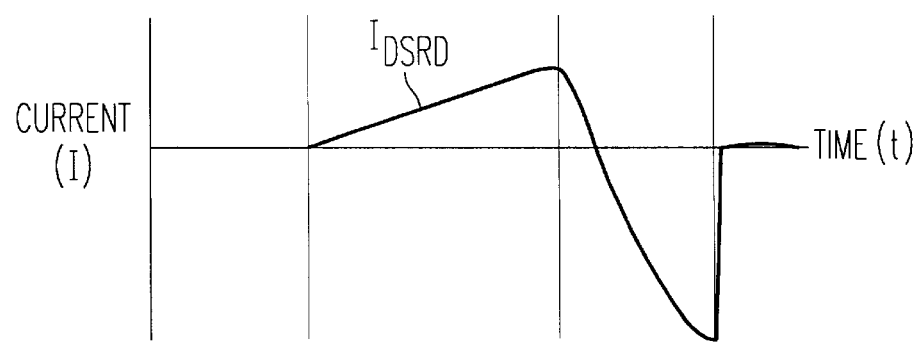

In the circuit 56, the pumping charge can be increased by decreasing the size of the pumping inductor 24. When the DSRD 22 breaks current, that part of the DSRD current that is switched into the pumping inductor 24 increases. The energy corresponding to that part of the current, however, will be lost. To substantially avoid these losses, another pumping circuit is provided in a pulse generating circuit 62 constructed in accordance with another embodiment of the present invention. With reference to FIG. 9, the end of the pumping inductor 24, which had been connected to the base of DSRT (FIG. 4), is now connected to the base of a second DSRT 64. A circuit comprising a diode 66 and a capacitor 68 is connected to the base of the second DSRT 64 in the same manner as the circuit comprising the diode 58 and capacitor 60 is connected to the base of the first DSRT 12. The collector of the second DSRT 64 is connected to a DC power source 71, which may be the same source 14 that is connected to the collector of the first DSRT. The emitter of the second DSRT 64 is connected to a transformer 70. In the pumping circuit (i.e., inductor 24 and capacitor 68), an oscillating process occurs that is essentially identical to that of the main pumping circuit (i.e., the inductors 18 and 52, and capacitor 60). When the DSRT 64 is turned on by a triggering pulse via the transformer 70, the pumping current via the inductors 18, 24 and 52 linearly increases, as shown in FIG. 10. When the DSRT 64 breaks current, the inductor 24 current reverses direction, and the currents of the inductors 18, 24 and 52 are summed up on the DSRD 22. When the DSRD 22 breaks current, as shown in FIG. 10, the currents of these inductors are switched into the load resistor 28.

Generally speaking, the circuit 62 can be configured such that, during the current switching, the exchange of currents between the inductors is essentially negligible. For example, when one part of the inductor current goes to the load, the other part of the current goes to the pumping inductor 24, and this part is lost. This current exchange is essentially absent, when the following conditions are satisfied:

$$I52 \times L52 = I18 \times L18 = I24 \times L24 \qquad (3)$$

$$L52 \times (C60 + Cc_{12}) = L24(C68 + Cc_{64}) \qquad (4)$$

where I52, I18 and I24 are the inductor currents; L52, L18, and L24 are the corresponding inductances; C60, C68 are capacitances of the capacitors 60 and 68; and $Cc_{12}$, $Cc_{64}$ are the capacitances of the DSRT collectors.

The preferred method by which to satisfy conditions (3) and (4) is to make all inductors and capacitors equal, that is, $$L52 = L18 = L24 \qquad (5)$$

$$C60 = C68. \qquad (6)$$

In the case when only one DC power supply is used for both DSRTs, the second DSRT 64 is preferably turned on at the middle of the turn on state period of the first DSRT 12. The DSRT 12 or 64 current is $$I = Vt/L, \qquad (7)$$

where V is the power supply DC voltage, L is the total inductance, and t is the time. For the first DSRT 12, the total inductance is the sum of the two inductors 52 and 18. For the second DSRT 64, there is only one inductor 24.

To reach the same current in both arms, the turn on period of the second DSRT is preferably half of the first turn on period (FIG. 10):

$$t1 = 2t2 \qquad (8)$$

In the case of turn on time being the same for both DSRTs, the collector voltage of the first DSRT 12 is preferably twice the voltage of the second DSRT 64:

$$V12 = 2V64 \qquad (9)$$

The pulse generating circuit 62 (FIG. 9) increases the current switched to the load resistor 28. The energy associated with pumping current into the pumping inductor 24 is switched by the DSRD into the load in the same manner as the energy in the inductors 18 and 52. Current in the capacitor 68 oscillates to increase the current in the pumping inductor 24. When the DSRT breaks, the current in the pumping inductor 24 is added to the DSRD 22, along with the current in inductors 18 and 52.

While certain advantageous embodiments have been chosen to illustrate the invention, it will be understood by those skilled in the art that various changes and modifications can be made herein without departing from the scope of the invention as defined in the appended claims.

What is claimed is:

1. A pulse generating circuit comprising:
   a power supply;
   a step recovery transistor having its collector connected to said power supply;
   a trigger pulse generating device connected between the base and emitter of said step recovery transistor; and
   a pulse forming network connected to said step recovery transistor for receiving power from said power supply when said trigger pulse is applied to turn on said step recovery transistor, said pulse forming network comprising a storage inductor connected in parallel with a series connected separating diode and a step recovery diode, said separating diode and said step recovery diode being in reverse polarity with respect to each other, a pumping circuit comprising a series connected pumping inductor and pumping resistor, said pumping circuit being connected to the base of said step recovery transistor and to said step recovery diode, a load resistor connected to the junction of said step recovery diode and said pumping circuit, and a second inductor connected at one end to the junction of said separating diode and said storage inductor and connected at the other end to the base of said step recovery transistor;
   wherein current passed via said step recovery transistor increases in said storage inductor and said pumping inductor and is blocked by said separating diode to inject electron-hole plasma from said pumping inductor into said step recovery diode when said step recovery transistor is conducting, said step recovery transistor blocking current at the end of said trigger pulse, said storage inductor and said second inductor reversing polarity to bias said separating diode into a conducting state to extract said plasma from said step recovery diode, said second inductor charging a capacitance corresponding to said step recovery transistor collector, said step recovery diode blocking current after said plasma has been extracted to switch current from said storage inductor and said second inductor into said load resistor to generate a pulse.

2. A pulse generating circuit as claimed in claim 1, wherein said step recovery transistor is a drift step recovery transistor.

3. A pulse generating circuit as claimed in claim 1, wherein said step recovery diode is configured to block current when current in said second inductor reaches a maximum value while oscillating to charge said collector capacitance such that current in said second inductor substantially coincides and is summed with current in said storage inductor in said step recovery diode when said step recovery diode breaks current, said pulse not being affected by said collector capacitance.

4. A pulse generating circuit as claimed in claim 1, further comprising a series circuit comprising a capacitor and a diode, said series circuit connected at one end thereof to the base of said step recovery transistor and at the other end thereof to ground, said step recovery diode having polarity to prevent charging of capacitance thereof by said power supply when said step recovery transistor is conducting, said capacitor being charged along with said collector capacitance by said second inductor, said series circuit increasing the duration of time said step recovery diode is conducting and the ratio of the voltage across said step recovery diode and the voltage across said step recovery transistor.

5. A pulse generating circuit comprising:

a first power supply;

first and second step recovery transistors having their respective collectors connected to said first power supply;

first and second series circuits, each comprising a capacitor and a diode, said first and second series circuits connected at one end thereof to the base of said first and second step recovery transistors, respectively, and at the other end thereof to ground, said capacitor in each of said first and second series circuits being prevented from charging by said first power supply when the corresponding one of said first and second step recovery transistors is conducting, said first and second series circuits increasing the duration of time said step recovery diode is conducting and the voltage across said step recovery diode with respect to said first and second step recovery transistors;

a trigger pulse generating device connected between the base and emitter of each of said first and second step recovery transistors; and a pulse forming network for receiving power from said first power supply when said trigger pulse is applied to turn on said first and second step recovery transistors, said pulse forming network comprising a storage inductor connected in parallel with a series connected separating diode and a step recovery diode, said separating diode and said step recovery diode being in reverse polarity with respect to each other, a second inductor in series with said storage inductor and connected to the base of said first step recovery transistor, a pumping inductor connected at one end to the base of said second step recovery transistor and at the other end thereof to said step recovery diode, and a load resistor connected to the junction of said step recovery diode and said second inductor;

wherein current passed via said first and second step recovery transistors increases in said storage inductor, said second inductor and said pumping inductor and is blocked by said separating diode to inject electron-hole plasma from said pumping inductor into said step recovery diode when said first and second step recovery transistors are conducting, said first and second step recovery transistors blocking current at the end of said trigger pulse, said storage inductor and said second inductor reversing polarity to bias said separating diode into a conducting state to extract said plasma from said step recovery diode, said second inductor charging a capacitance corresponding to the collector of said first step recovery transistor and said pumping inductor charging a capacitance corresponding to the collector of said second step recovery transistor, said capacitor in each of said first and second series circuits being charged along with said collector capacitance of said first and second step recovery transistors, respectively, said step recovery diode blocking current after said plasma has been extracted to switch current from said storage inductor and said second inductor into said load resistor to generate a pulse, said second series circuit operating to increase the duration of time said step recovery diode is conducting and the voltage across said step recovery diode with respect to the voltage across said first and second step recovery transistors.

6. A pulse generating circuit as claimed in claim 5, wherein the inductance of said storage conductor, said second inductor and said pumping inductor are substantially equal and the capacitance of said capacitor in each of said first and second series circuits are substantially equal.

7. A pulse generating circuit as claimed in claim 6, wherein the said second step recovery transistor is turned on in approximately the middle of the period during which said first step recovery transistor is conducting.

8. A pulse generating circuit as claimed in claim 6, further comprising a second power supply, said second step recovery transistor being turned on at approximately the same time as said first step recovery transistor, the voltage supplied by said first power supply to the collector of said first step recovery transistor being approximately twice the voltage supplied by said second power supply to the collector of said second step recovery transistor.

9. A method of generating a pulse comprising the steps of:

generating a trigger pulse;

conducting current through a first step recovery device to supply power to a pulse forming network for substantially the duration of said trigger pulse;

providing power to a pumping inductor and a storage inductor in said pulse forming network with current;

preventing current from flowing from said storage inductor to a second step recovery device in said pulse forming network during said conducting step;

injecting electron-hole plasma into said second step recovery device from said pumping inductor during said conducting step;

supplying current from said storage inductor to said second step recovery device after said conducting step to extract plasma from said second step recovery device until substantially all plasma is extracted from said second step recovery device; and switching current of said storage inductor from said second step recovery device to a load resistance to generate a pulse;

wherein said first step recovery device is a step recovery transistor and further comprising the step of decreasing recharging of the capacitance associated with the transistor collector into said load resistance, said decreasing step comprising the steps of:

providing power to a second inductor during said conducting step;

charging said collector capacitance via said second inductor during said preventing step;

adding current from said second inductor to current from said storage inductor to extract plasma during said supplying step; and switching current of said second inductor to said load resistance during said switching step for switching current of said storage inductor from said second step recovery device to a load resistance to generate said pulse.

10. A method of generating a pulse comprising the steps of:

generating a trigger pulse;

conducting current through a first step recovery device to supply power to a pulse forming network for substantially the duration of said trigger pulse;

providing power to a pumping inductor and a storage inductor in said pulse forming network with current;

preventing current from flowing from said storage inductor to a second step recovery device in said pulse forming network during said conducting step;

injecting electron-hole plasma into said second step recovery device from said pumping inductor during said conducting step;

supplying current from said storage inductor to said second step recovery device after said conducting step to extract plasma from said second step recovery device until substantially all plasma is extracted from said second step recovery device; and switching current of said storage inductor from said second step recovery device to a load resistance to generate a pulse;

wherein said first step recovery device is a step recovery transistor and further comprising the step of connecting a first diode and a first capacitor in parallel with the capacitance associated with the collector of said step recovery transistor to increase voltage across said second step recovery device with respect to said step recovery transistor and the duration of time said second step recovery device conducts current during said supplying step.

11. A method of generating a pulse as claimed in claim 10, wherein said first step recovery device is a drift step recovery transistor.

12. A method of generating a pulse as claimed in claim 10, wherein said second step recovery device is selected from the group consisting of a step recovery diode and a drift step recovery diode.

13. A method of generating a pulse comprising the steps of:

generating a trigger pulse;

conducting current through a first step recovery device to supply power to a pulse forming network for substantially the duration of said trigger pulse;

providing power to a pumping inductor and a storage inductor in said pulse forming network with current;

preventing current from flowing from said storage inductor to a second step recovery device in said pulse forming network during said conducting step;

injecting electron-hole plasma into said second step recovery device from said pumping inductor during said conducting step;

supplying current from said storage inductor to said second step recovery device after said conducting step to extract plasma from said second step recovery device until substantially all plasma is extracted from said second step recovery device; and switching current of said storage inductor from said second step recovery device to a load resistance to generate a pulse;

wherein said pulse forming network further comprises a first step recovery transistor connected to said pumping inductor, and further comprising the step of increasing current in said pumping inductor by conducting current through said first step recovery transistor.

14. A method of generating a pulse as claimed in claim 13, wherein said first step recovery device is a second step recovery transistor having a first diode and a first capacitor connected in parallel with the capacitance associated with the collector of said second step recovery transistor, and said first step recovery transistor has a second diode and a second capacitor connected in parallel with the capacitance associated with the collector of said first step recovery transistor, said storage inductor and pumping inductor being substantially equivalent and said first capacitor and second capacitor being substantially equivalent, and wherein said increasing step comprises the step of switching said first drift step recovery transistor into a conducting state in approximately the middle of the conducting period of said second step recovery transistor.

15. A method of generating a pulse as claimed in claim 14, wherein at least one of said first and second step recovery transistors is a drift step recovery transistor.

16. A method of generating a pulse as claimed in claim 13, wherein said first step recovery device is a second step recovery transistor having a first diode and a first capacitor connected in parallel with the capacitance associated with the collector of said second step recovery transistor, and said first step recovery transistor has a second diode and a second capacitor connected in parallel with the capacitance associated with the collector of said first step recovery transistor, said storage inductor and pumping inductor being substantially equivalent and said first capacitor and second capacitor being substantially equivalent, and wherein said increasing step comprises the step of switching said second drift step recovery transistor into a conducting state at approximately the same time as said first step recovery transistor, the collector voltage of said first step recovery transistor being approximately twice the collector voltage of said second step recovery transistor.

* * * * *